United States Patent [19]

Pfaff

[11] Patent Number: 4,713,022

[45] Date of Patent: Dec. 15, 1987

[54] SOCKET FOR FLAT PACK ELECTRONIC DEVICE PACKAGES

[76] Inventor: Wayne K. Pfaff, 309 Steeplechase, Irving, Tex. 75062

[21] Appl. No.: 893,170

[22] Filed: Aug. 5, 1986

[51] Int. Cl.[4] .............................................. H01R 9/09
[52] U.S. Cl. ........................................ 439/331; 439/526
[58] Field of Search .......... 339/17 CF, 75 M, 75 MP; 439/68–73, 259–270, 330, 331, 525, 526

[56] References Cited

U.S. PATENT DOCUMENTS

| | | | |
|---|---|---|---|
| 3,409,861 | 11/1968 | Barnes et al. | 339/17 CF |
| 4,188,085 | 2/1980 | Aldridge et al. | 339/17 CF |
| 4,268,102 | 5/1981 | Grabbe | 339/75 M |
| 4,341,433 | 7/1982 | Cherian et al. | 339/17 CF |
| 4,354,729 | 10/1982 | Grabbe et al. | 339/17 CF |
| 4,460,223 | 7/1984 | Brown et al. | 339/17 CF |

OTHER PUBLICATIONS

"Soft-Touch" Flat Pack Sockets Brochure, TD-2608, 3-1981, published by 3M Co.
"Welcon Burn-In/Test Contactors" Brochure, p. 14, published by Wells Electronics.
"Burn-In/Test Flat Pack Socket" Brochure, p. 68, published by Robinson Nugent, Inc.
"Enplas Sockets" Brochure, published by Enplas.

*Primary Examiner*—John McQuade
*Attorney, Agent, or Firm*—Kanz, Scherback & Timmons

[57] ABSTRACT

Disclosed are sockets for flat pack electronic device packages on a carrier. The socket includes a lid for receiving the carrier and the flat pack package in a loading position. The lid is rotated to a latched position so as to align each of the ribbon leads of the electronic device package with one of a plurality of contacts embedded in the base of the socket. Means are provided to automatically align the carrier and flat pack package with the socket when the carrier is loaded into the lid.

5 Claims, 10 Drawing Figures

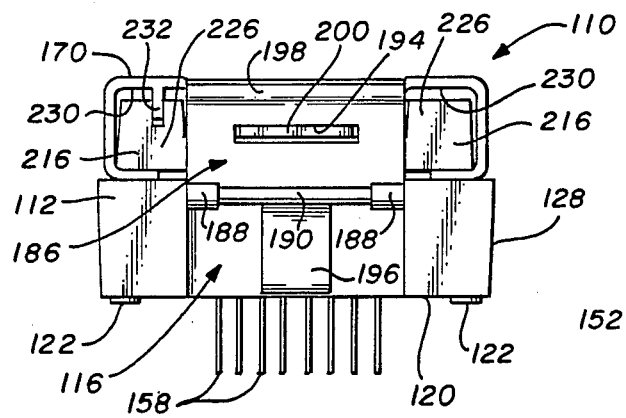
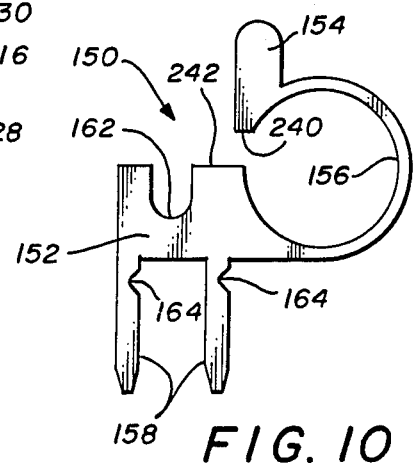
FIG. 6
FIG. 10
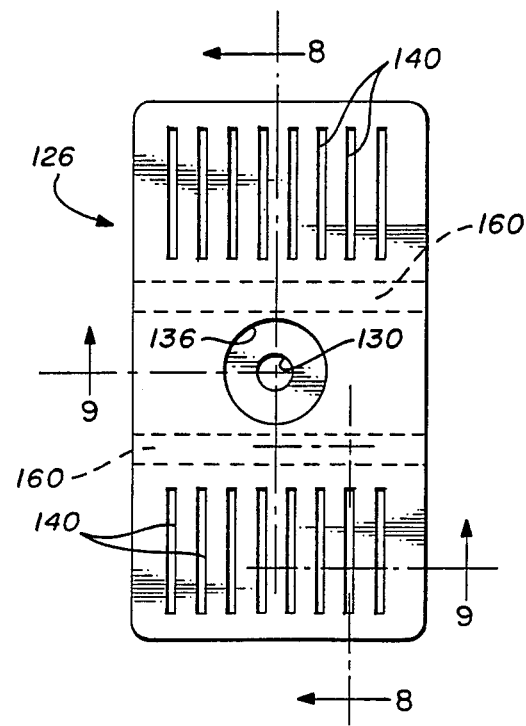
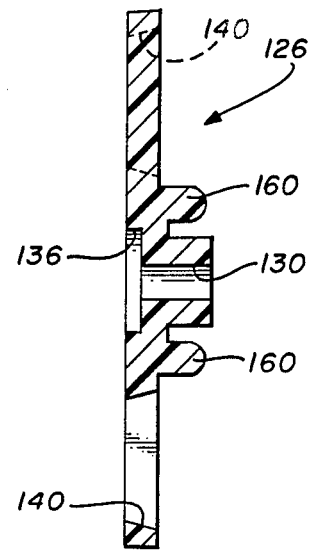
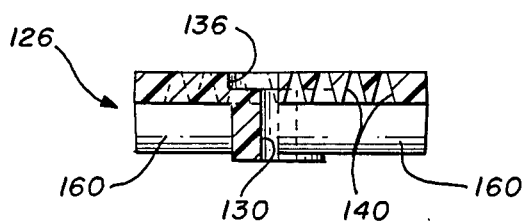
FIG. 7
FIG. 8
FIG. 9

SOCKET FOR FLAT PACK ELECTRONIC DEVICE PACKAGES

FIELD OF THE INVENTION

This invention relates generally to electronic components. More particularly, it relates to sockets for receiving electronic device packages.

BACKGROUND OF THE INVENTION

In the semiconductor electronics industry, various semiconductor devices are packaged in standard electronic device packages. One such standard package is referred to as a "flat pack". The flat pack electronic device package comprises an enclosed housing, usually rectangular, containing a semiconductor device and having one or more rows of relatively thin, flexible ribbon leads extending laterally from one or more side edges of the housing. The ribbon leads of the flat pack are adapted to be soldered to preformed locations on the surface of the printed circuit board to reduce the overall height of the printed circuit board and for other reasons.

Due to the fragile nature of the ribbon leads on a flat pack electronic device package, as well as a desire to protect the housing and the semiconductor device itself, flat packs are commonly stored and transported on plastic bodies called carriers. As shown in FIGS. 1 and 2, a typical carrier 10 receives the housing of a flat pack (not shown) in close confinement with cavity 14. Each of the ribbon leads (not shown) extending from the housing are received within one of the parallel channels 16 defined by teeth 18 and communicating with the cavity 14. Although not shown, fingers or clips may be mounted on the carrier to grip the flat pack housing and retain it within the cavity. The carrier defines three indentations 12 along its longitudinal edges. The asymmetrical arrangement of these indentations enables the carrier to be oriented by automatic machinery for loading or unloading onto storage or handling structures. The underside of the carrier also includes a pair of laterally spaced, longitudinal ribs 20 which space the carrier and flat pack above any surface on which the carrier is placed.

It is desirable to test all or a predetermined percentage of semiconductor devices during manufacturing operations. Standard testing procedures include mounting a plurality of semiconductor devices on a test board, known as a burn-in board, and simultaneously subjecting the devices to various environmental and electrical stresses while mounted on the burn-in board. The devices are then removed from the burn-in board and electronically tested in one or more test fixtures. Those devices failing the functional tests are discarded or classified according to test performance.

Since it is desirable to test all or a large portion of the production output from a manufacturing line for semiconductor devices, it is also desirable that the loading and unloading of the electronic device packages with respect to the various test equipment be accomplished as rapidly and economically as possible. The electronic device packages, of whatever type, may be loaded and unloaded by hand from the test fixtures. This method, however, is extremely time-consuming and therefore expensive. It is preferable to utilize automatic handling arrangements such as robotics, to insert or remove the electronic device packages from the various test equipment.

Semiconductor devices, even when mounted in packages, must be handled carefully to avoid damage to the devices or to the package. For instance, the ribbon leads on the flat pack type package are relatively fragile and easily torn if subjected to excessive forces. The housing of a flat pack may also be damaged, and even the semiconductor device contained in the housing may also be damaged, if not handled carefully. Unfortunately, conventional techniques involving manual handling of the electronic device packages produce an undesirably high rate of damage to flat pack electronic device packages. Frequent insertion and removal of the electronic device package from sockets or other test fixtures also exposes the electronic device package and its ribbon leads to destructive forces.

Sockets have been developed which reduce or eliminate the force required to load or unload a flat pack electronic device package from the socket. Typically conventional flat pack type sockets include a base portion having a plurality of electrically conductive contacts mounted therein. A structure is provided mounted on the base portion for securing the flat pack electronic device package to the base portion with all of the ribbon leads aligned and in contact with one of the socket contacts on the base portion. Such sockets reduce the damage rate but still suffer from several limitations and inefficiencies. For instance, it is still necessary with conventional devices to manually align, load and unload the flat pack on a carrier with the socket. Some conventional sockets require that the flat pack electronic device package be removed from its protective carrier for loading into the socket. Further, conventional flat pack socket designs sometimes secure the flat pack to the socket by applying a force directly to the flat pack housing or the carrier bearing the flat pack. As previously discussed, this is undesirable and leads to damage to the flat pack and/or carrier.

Another problem associated with conventional flat pack sockets is that of making a conductive connection with each of the ribbon leads of that flat pack. If the force applied to the ribbon leads by the socket contacts is excessive, the ribbon contacts may be damaged or destroyed. For instance, some conventional flat pack sockets employ wire type contacts. Wire type contacts apply all the force to a relatively narrow portion of the ribbon lead, thereby tending to deform or damage the ribbon lead.

Mounting conventional flat pack sockets on a printed circuit board (such as a burn-in board or test fixture) or the like poses a particular problem. Typically, this is accomplished by soldering mounting tabs or the leads projecting from the bottom of the socket into a like number of preformed aligned holes in a printed circuit board or the like. Typically the holes are arranged in parallel rows on the printed circuit board. However, depending on the nature of the semiconductor device to be tested, the test equipment to be used and the test procedure to be followed, some of the holes in each row are unnecessary and therefore omitted. Consequently, each of the leads mounted in the socket must conform to the appropriate hole pattern in the printed circuit board or the like. Thus, each socket must be uniquely configured for a specific application and a variety of leads must be constructed and utilized in the socket in the correct sequence, all of which increases assembly and manufacturing costs.

SUMMARY OF THE INVENTION

The present invention provides for a socket a flat pack electronic device package supported on a carrier. The socket includes a base with a plurality of resilient contacts mounted in the base. A portion of the contacts extend through the bottom of the socket base and enable the socket to be soldered and electrically connected to a printed circuit board or the like. A lid is mounted by a hinge to the base. The lid is shiftable between a fixed loading position for receiving the carrier bearing the flat pack and a latched position adjacent and parallel with the base in which the ribbon leads of the flat pack are brought into electrical contact with the contacts on the base of the socket. The force applied to the ribbon leads is limited to prevent damage to the ribbon leads or to the device package. Means are provided to automatically align the ribbon leads of the flat pack with the contacts in the base when the carrier is received in the lid to ensure effective conductive contact when the lid assumes its latched position. The contacts of the socket include mounting tabs which are detachable, thus enabling the socket to be easily and quickly configured to match a hole pattern in a printed circuit board or the like. The invention thus provides a flat pack socket which may be automatically loaded and unloaded and which automatically aligns its ribbon leads with the socket contacts without causing damage to the flat pack itself.

BRIEF DESCRIPTION OF THE DRAWINGS

So that the manner in which the features and advantages of the invention are obtained and can be understood in detail, a more particular description of the invention briefly summarized above may be had by reference to the embodiments thereof which are illustrated in the accompanying drawings, which drawings form a part of the specification and in which like numerals depict like parts in the several views. It is noted, however, that the appended drawings illustrate only a preferred embodiment of the invention and are therefore not to be considered limiting of its scope, for the invention may admit to other equally effective embodiments.

FIG. 6 is an end view of the socket of FIG. 3.

FIG. 7 is a top view of an upper section of the socket base of FIG. 3.

FIG. 8 is a longitudinal cross-sectional view taken along plane 8—8 of FIG. 7.

FIG. 9 is a partial transverse cross-sectional view along plane 9—9 of FIG. 7.

FIG. 10 is a side view of a contact of the socket of FIG. 3.

DETAILED DESCRIPTION OF THE INVENTION

Figure 5:
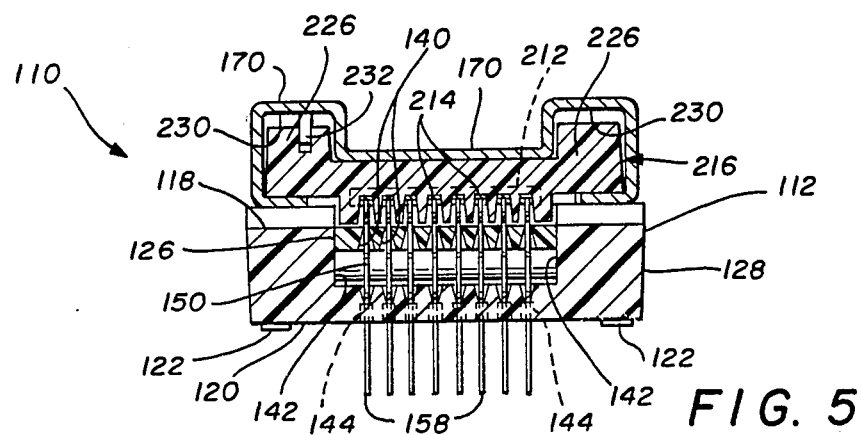
FIG. 5 is a transverse cross-sectional view of the socket, carrier and flat pack electronic device package of FIG. 3.

Referring now to FIGS. 3-6, the reference numeral 110 generally indicates the socket of the present invention. The socket includes base 112 which is preferably constructed of an easily molded material, such as ryton or nylon, which is electrically insulating and exhibits a tolerance for high temperature environments such as encountered during burn-in procedures. The base defines first end 114 and second end 116 as well as upper surface 118 and lower surface 120. One or more protuberances 122 are formed on the lower surface of the base and act to raise the base above the surface of a printed circuit board (not shown) to provide access, such as for cleaning purposes, after mounting the socket on a printed circuit board (not shown).

For purposes of convenience of assembly and manufacture of the socket, the base may be constructed of an upper section 126 and lower section 128. The upper section is shown in greater detail in FIGS. 7-9. The upper section includes opening 130 extending therethrough. As shown more clearly in FIG. 4, the opening in the upper section is aligned with a like shaped passageway 132 in the lower section of the base. The upper section is secured to the lower section by screw, rivet 134 having a head received within countersunk section 136 of the opening 130. Of course, it is recognized that the base of the socket may be formed in other arrangements, such as in a unitary manner, without affecting the remaining structure and function as described herein. The upper section 126 also includes two rows of parallel slots 140 with the rows separated by the opening 130. The slots are each tapered inwardly in both a longitudinal and lateral direction within the upper section toward the upper surface thereof.

The lower section 128 of the base includes cavity 142. The cavity communicates with each of the slots 140 in the upper section. The cavity 142 also communicates with four rows of apertures 144 with two rows on each side of the passageway 132. The apertures extend from the cavity to bottom surface 120 of the socket base. The apertures in adjacent rows are aligned in pairs with one of each slot 140 in the upper section of the body.

Figure 3:
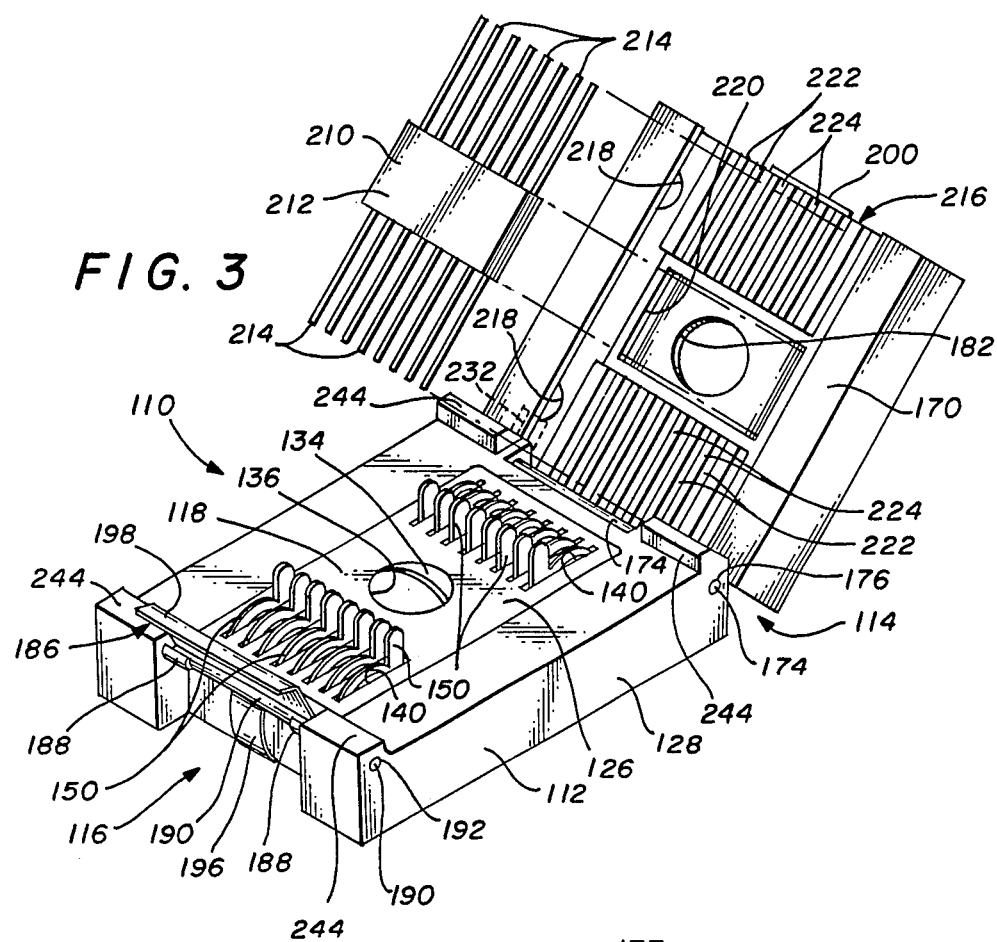
FIG. 3 is a perspective view, partially exploded, of the socket of this invention and a carrier with a flat pack electronic device package.

Located within each of the slots 140 is a conductive contact 150 as shown in detail in FIG. 10. The contact is preferably constructed in a unitary manner of a resilient, electrically conductive material. Each contact includes a main section 152 and upper contact point 154 connected to the main section 152 by arcuate section 156. The contact also includes a pair of downwardly extending tabs 158. The contact may be constructed with one or more tabs 158 if desired. Each of the contacts is secured to the lower section 128 of the socket base by the tabs 158, each located in close confinement in one of the apertures 144 in the lower section of the base and aligned with a slot 140 in the upper section. The apertures 144 each present a funnel-shaped end to the cavity 142 of the socket base in order to assist in inserting the tabs into the apertures. The arcuate sections 156 of the contacts 150 each extend upwardly through the aligned slot 140 in the upper portion so that the upper contact points 154 of the contacts project through the upper surface of the base in two parallel rows as shown in FIG. 3. A pair of longitudinally spaced transverse ribs 160 are formed on the underside of the upper section 126 of the base. The ribs extend transversely and engage indentation 162 in the main section 152 of the contacts so as to align and secure the contacts within the cavity of the lower body portion.

Each tab 158 preferably includes a notch 164 enabling one or more of the tabs to be easily manually detached from the contact. This is advantageous in that a single contact design may be manufactured and assembled in the socket and various of the lower tabs 158 detached to conform to the location of preformed holes (not shown) in a printed circuit board or the like (not shown). The remaining tabs may then be inserted and soldered within the preformed printed circuit board holes to secure the socket on the printed circuit board and to electrically connect the electronic device package to the circuit on the printed circuit board.

Figure 1:
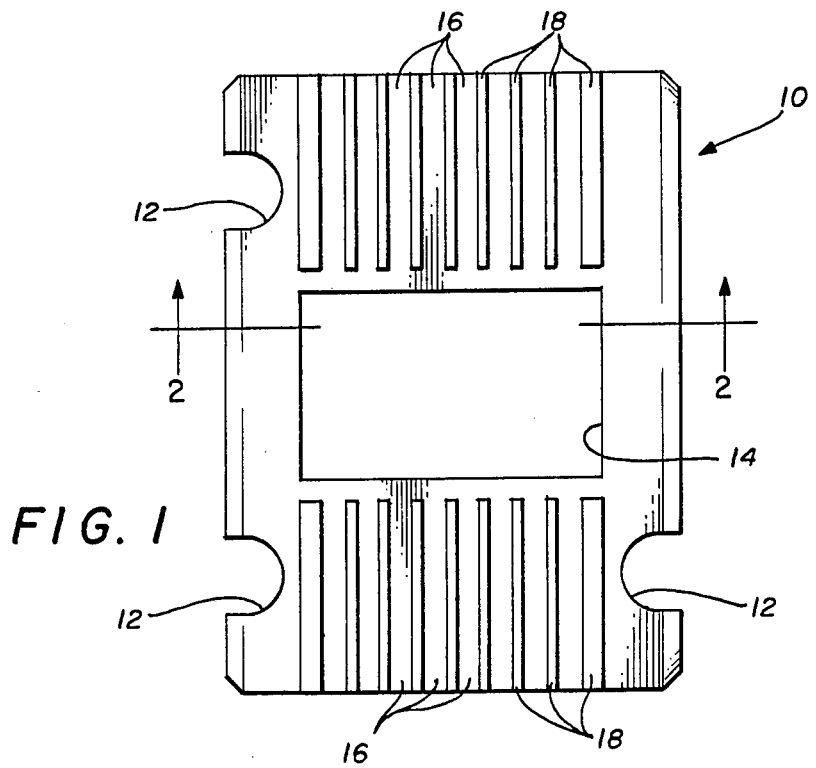
FIG. 1 is a top view of a carrier for a flat pack electronic device package.
Figure 4:
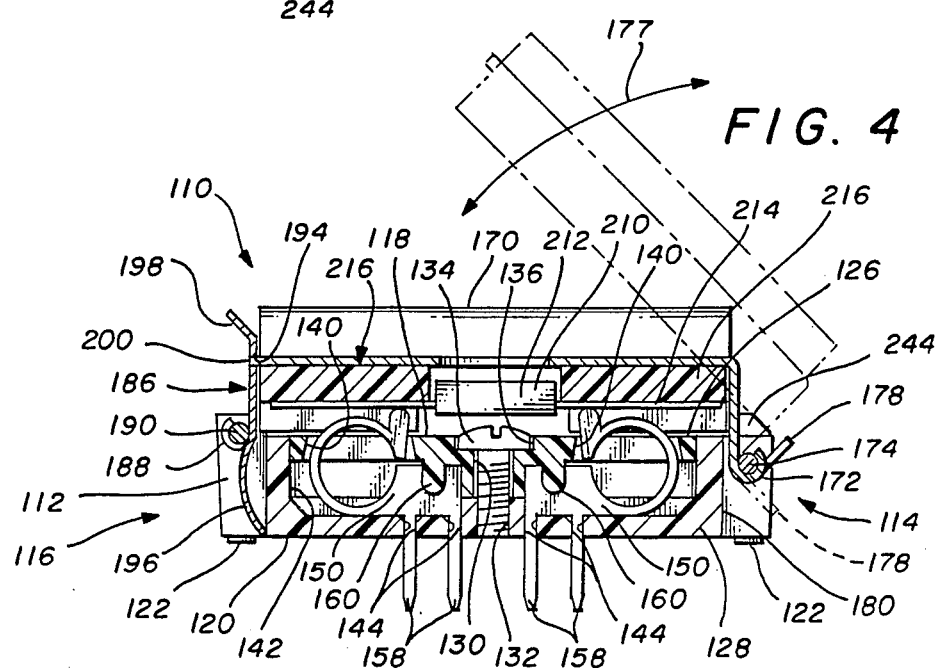
FIG. 4 is a longitudinal cross-sectional view of the socket, carrier and flat pack electronic device package of FIG. 3.

Lid 170 is mounted by spaced hinges 172 on hinge pin 174. Each end of the hinge pin 174 is secured in an aligned holes 176 in the first end 114 of the base. The lid may be rotated in direction 177 (shown in FIG. 4) between a fixed loading position as shown in FIG. 1 and a latched position adjacent and parallel with the upper surface of the body as shown in FIG. 4. Flange 178 on the lid contacts first end surface 180 and acts to limit travel of the lid away from the latched position and to provide a fixed preset loading position for the lid with respect to the base of the socket. The lid includes opening 182 enabling external visual inspection of the contents of the socket when the lid is in its latched position.

Latch 186 is rotatively mounted by flanges 188 on hinge pin 190. Each end of the hinge pin 190 is secured in an aligned holes 192 in the second end 116 of the body of the socket. The latch includes transverse slot 194, integral spring 196 and lip 198. As the lid is brought into its latched position, flange 200 on the end of the lid 170 encounters lip 198 and deflects the latch from its relaxed position against the force of spring 196. When the flange 200 enters slot 194, spring 196 urges the latch back to its relaxed position with the lid secured in its closed position. The lid may be released by manually deflecting the latch away from flange 200 and rotating the lid away from the latch.

Figure 2:
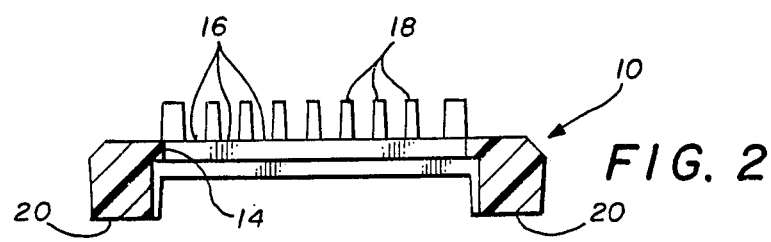
FIG. 2 is a cross-sectional view taken along plane 2—2 of the carrier of FIG. 1.

Flat pack electronic device package 210 includes housing 212 containing a semiconductor device (not shown) and two rows of parallel flexible ribbon leads 214 extending from opposing side edges of the housing. Of course, other versions of the flat pack electronic device package employ ribbon leads extending from one, or more side edges and sometimes with more than one row of ribbon contacts extending from each of the side edges, depending on the characteristics of the semiconductor device contained in the housing. Carrier 216 (substantially similar to that shown in FIGS. 1 and 2 and previously discussed) is provided to support and carry flat pack 210. Carrier 216 includes three asymmetrical indentations 218 (one of which is not shown in FIG. 3) on its longitudinal edges for automatic orientation of the carrier. Cavity 220 is formed in the carrier for receipt and close confinement of housing 212 of the flat pack. A plurality of parallel channels 222, defined by teeth 224, are formed in the carrier. Each of the ribbon leads 214 is received in one of the channels 222 when the flat pack is carried by carrier 216. The bottom of the carrier includes a pair of laterally spaced longitudinal ribs 226 similar to ribs 120 in FIG. 2.

The lid 170 is constructed to receive the carrier 216 with the flat pack electronic device package 210. The lid is preferably constructed of rigid material such as stainless steel. The lid 170 defines a pair of laterally spaced channels 230 is constructed to receive the ribs 226 on the underside of the flat pack carrier in close sliding confinement. Means are provided with the lid to accurately and automatically align and position the carrier 216 and flat pack 210 with respect to lid 170 and, therefore, also with respect to base 112 of the socket. In the illustrated embodiment of the invention the alignment means includes tang 232 projecting into at least one of the channels 230 of the lid 170 adjacent the hinge 186. The tang is integrally formed with the lid by deforming a portion of the lid forming one of the channels 230. Of course, other arrangements may be employed to form tang 232 as are found effective. The end of the carrier 216 registers against the tang and is thus accurately positioned with respect to the lid. When the lid is in the loading position with the flange 178 of the lid in contact with surface 180 of the socket, as in FIG. 1, the carrier 216 containing a flat pack electronic device package 210 may be automatically inserted into the lid with the electronic device package presented to the base of the socket. If the lid is rotated to its latched position between shoulders 244 on upper surface 118 of the socket, as in FIG. 4, the carrier and flat pack are inverted with each of the ribbon leads of the flat pack electronic device package aligned and brought into contact with one of the upper contact points 154 of the socket contacts 150 as shown in FIGS. 4 and 5.

In the latched position the arcuate section 156 of each contact 150 is compressed so that the contact point 154 is resiliently urged upwardly into contact with the aligned ribbon contact 214 of the flat pack. The resilient force exerted on the ribbon leads is determined by such factors as the shape, size, thickness and material of the contacts 150. One limit to the compression of the arcuate section, and therefore an upper limit of the resilient force applied to ribbon lead, is provided by contact between edge 240 of the upper contact point and upper edge 242 of the main section when the arcuate section is compressed. This arrangement enables the socket to maintain a reliable contact with the electronic device package without damaging the ribbon leads in the process. This limit ensures that the ribbon leads will not be damaged while the flat pack is loaded into the socket.

Employing the socket described, the semiconductor device in the flat pack electronic device package is electrically connected exteriorly from the socket for performing the various tests previously described. At the completion of the testing the latch is released; the lid is rotated to its loading position; and the carrier and the flat pack electronic device package automatically removed from the socket. All of this may be accomplished by automatic machinery without damaging the semiconductor device or the flat pack electronic device package.

Although the invention has been described above with regard to particular and preferred embodiments, these are advanced for illustrative purposes only and are not intended to limit the scope of this invention. For instance, it is within the scope of this invention to provide standoffs (not shown) on the upper surface 118 of the body of the socket to contact the lid when the lid is in the latched position. The standoffs would ensure proper spacing between the ribbon leads of the flat pack electronic device package and the contacts of the socket and also act to limit the force applied to the ribbon contacts by the socket contacts. Further, a plurality of the sockets may be mounted on a common printed circuit board for use as a burn-in board for flat pack electronic devices. These variations remain within the spirit and scope of the invention as defined by the appended claims.

What is claimed is:

1. A socket for a flat pack electronic device package having a housing and plurality of ribbon leads supported in a carrier comprising:
   (a) a base defining opposite upper and lower surfaces;
   (b) a plurality of electrically conductive contacts mounted in said base and extending through said base from said upper surface to said lower surface, each of said contacts including a resilient upper contact point projecting from said upper surface and at least one tab projecting from said lower surface for electrical connection exteriorly of the socket;
   (c) a lid pivotally connected to said base and shiftable between a loading position for receipt of a carrier supporting a flat pack electronic device package and a latched position with said lid adjacent and parallel with said upper surface with each ribbon lead of the flat pack package aligned and in contact with one of said contacts in said base, said lid defining a pair of laterally spaced channels for sliding receipt of the carrier containing the electronic device package to support the carrier from the underside thereof;
   (d) latch means for releaseably securing said lid in said latched position; and
   (e) means depending from said lid and cooperating with said channels to engage said carrier and thereby align each of the ribbon leads of the flat pack package with one of said contact points when said lid is in the latched position.

2. The socket defined in claim 1 wherein said means for aligning depending from said lid comprises a tang extending into one of said channels in register with the carrier when the carrier is loaded into said lid.

3. The socket of defined in claim 1 wherein at least one of said contacts mounted in said base includes at least two independently detachable tabs extending through the bottom surface of said base.

4. The combination comprising:
   (a) a flat pack electronic device package having a housing and plurality of ribbon leads projecting from the housing and supported by a carrier; and
   (b) a socket including:
      (i) a base defining opposite upper and lower surfaces;
      (ii) a plurality of electrically conductive contacts mounted in said base and extending through said base from said upper surface to said lower surface, each of said contacts including a resilient upper contact point projecting from said upper surface and at least one tab projecting from said lower surface for electrical connection exteriorly of said socket;
      (iii) a lid pivotally connected to said base and shiftable between a loading position for receipt of a carrier supporting a flat pack electronic device package and a latched position with said lid adjacent and parallel with said upper surface with each ribbon lead of the flat pack package aligned and in contact with one of said contacts in said base and said lid defining a pair of laterally spaced channels for receipt of the carrier containing the device package to support the carrier from the underside thereof;
      (iv) latch means for releaseably securing said lid in said latched position; and
      (v) means depending from said lid and cooperating with said channels to engage said carrier and thereby align each of the ribbon leads of the flat pack package with one of said contact points when said lid is in said latched position.

5. A socket for a flat pack electronic device package having a housing and a plurality of ribbon leads supported in a carrier comprising:
   (a) a base defining opposite upper and lower surfaces;
   (b) a plurality of electrically conductive contact means mounted in said base and extending through the lower surface of said base for electrical interconnection with circuit means exterior of said base, each said contact means including a resilient upper contact point adapted to mate with a ribbon lead extending from a flat pack package supported in a carrier;
   (c) receiving and alignment means pivotally connected to said base and moveable between a first position and a second position, said receiving and alignment means comprising a body having first and second opposite sides and mounted on said base to align said first side thereof substantially parallel with said upper surface of said base when in said second position and including means for receiving a carrier supporting a flat pack package therein when in said first position and for aligning each ribbon lead of said flat pack package with one upper contact point of said contact means in said base, said receiving means comprising a pair of slots aligned in parallel and opposing relationship to receive and support said carrier from the underside thereof, and said alignment means comprising tang means cooperatively aligned with one of said slots to determine the position of said carrier within said means; and
   (d) latch means for releaseably securing said receiving and alignment means in said second position.

* * * * *

UNITED STATES PATENT AND TRADEMARK OFFICE
CERTIFICATE OF CORRECTION

PATENT NO. : 4,713,022
DATED : December 15, 1987
INVENTOR(S) : Wayne K. Pfaff

It is certified that error appears in the above-identified patent and that said Letters Patent is hereby corrected as shown below:

IN THE ABSTRACT

Line 5, delete "so as"

IN THE SPECIFICATION

Column 2, line 42, change "that" to ---the---
Column 3, line 3, delete "for" ; after "socket" insert -- for --.
Column 4, line 27, after "134" insert ---or the like---
Column 5, line 17, change "holes" to ---hole---
Column 5, line 30, change "holes" to ---hole---
Column 5, line 47, delete the comma (,)
Column 5, line 68, delete "is"

Signed and Sealed this

Thirtieth Day of August, 1988

*Attest:*

DONALD J. QUIGG

*Attesting Officer*     *Commissioner of Patents and Trademarks*